(12) United States Patent
Sheng

(10) Patent No.: US 9,780,729 B2
(45) Date of Patent: Oct. 3, 2017

(54) SIGNAL FREQUENCY CONVERSION CIRCUIT AND SIGNAL FREQUENCY CONVERSION METHOD

(71) Applicant: Huawei Technologies Co., Ltd., Shenzhen (CN)

(72) Inventor: Lanping Sheng, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/342,214

(22) Filed: Nov. 3, 2016

(65) Prior Publication Data

US 2017/0054414 A1 Feb. 23, 2017

Related U.S. Application Data

(63) Continuation of application No. PCT/CN2015/092097, filed on Oct. 16, 2015.

(30) Foreign Application Priority Data

Mar. 17, 2015 (CN) .......................... 2015 1 0117704

(51) Int. Cl.
*H04L 27/10* (2006.01)
*H03D 7/16* (2006.01)

(52) U.S. Cl.
CPC ..................... *H03D 7/16* (2013.01)

(58) Field of Classification Search
CPC .......... H03D 7/165; H03D 7/16; H03D 7/161; H04B 1/0003; H04B 1/0021; H04B 1/001;
(Continued)

(56) References Cited

U.S. PATENT DOCUMENTS 5,579,341 A * 11/1996 Smith .................. H04B 1/26
375/267
5,872,810 A * 2/1999 Philips ................ H04B 1/707
375/130
(Continued)

FOREIGN PATENT DOCUMENTS

CN 101119356 A 2/2008
CN 101262240 A 9/2008
(Continued)

OTHER PUBLICATIONS

T. Hentschel and G. Fettweis, "Sample rate conversion for software radio," in IEEE Communications Magazine, vol. 38, No. 8, pp. 142-150, Aug. 2000.*

(Continued)

*Primary Examiner* — Daniel Washburn
*Assistant Examiner* — Amneet Singh
(74) *Attorney, Agent, or Firm* — Conley Rose, P.C.

(57) ABSTRACT

A signal frequency conversion circuit is configured to reduce power consumption and resource costs of the signal frequency conversion circuit. Embodiments of the present disclosure include a primary-stage frequency conversion module and at least one subsequent-stage frequency conversion module that is in series connection, where the primary-stage frequency conversion module includes a first filter and a numerically controlled oscillator NCO, and an output of the first filter is connected to an input of the NCO; each subsequent-stage frequency conversion module includes a second filter and a subsequent-stage frequency conversion unit, and an output of the second filter is connected to an input of the subsequent-stage frequency conversion unit; and an output of the NCO is connected to an input of a second filter in a first subsequent-stage frequency (Continued)

conversion module in the at least one subsequent-stage frequency conversion module in series connection.

20 Claims, 4 Drawing Sheets

(58) Field of Classification Search
CPC .......... H04B 1/0017; H04B 1/30; H04B 1/38; H04L 27/38; H04L 7/0029; H04L 27/20; H04L 27/2637; H03B 28/00; H04J 1/05
See application file for complete search history.

(56) References Cited

U.S. PATENT DOCUMENTS

| | | | |
|---|---|---|---|
| 6,343,207 B1* | 1/2002 | Hessel | H04B 1/0003 455/552.1 |
| 6,975,685 B1* | 12/2005 | Merriam, Jr. | H04L 5/06 375/260 |
| 2002/0142748 A1 | 10/2002 | Earls | |
| 2005/0202841 A1* | 9/2005 | Brobston | H04B 1/0028 455/552.1 |
| 2005/0215193 A1* | 9/2005 | Kummetz | H04B 7/15585 455/1 |
| 2006/0111074 A1* | 5/2006 | Petilli | H04B 1/001 455/334 |
| 2006/0176990 A1* | 8/2006 | Oishi | H04L 7/0029 375/350 |
| 2010/0227572 A1* | 9/2010 | Foag | H04B 1/0003 455/84 |
| 2013/0148700 A1* | 6/2013 | Senant | H04B 7/14 375/211 |
| 2013/0202067 A1* | 8/2013 | Sahlman | H03D 7/18 375/340 |

FOREIGN PATENT DOCUMENTS

| | | |
|---|---|---|
| CN | 201114160 Y | 9/2008 |
| CN | 201464557 U | 5/2010 |
| CN | 102098005 A | 6/2011 |
| CN | 102176656 A | 9/2011 |
| CN | 203086407 U | 7/2013 |
| CN | 103248380 A | 8/2013 |
| CN | 104811143 A | 7/2015 |
| EP | 2534419 A1 | 12/2012 |
| KR | 20120070806 A | 7/2012 |

OTHER PUBLICATIONS

J. Valls, T. Sansaloni, A. Perez-Pascual, V. Torres and V. Almenar, "The use of CORDIC in software defined radios: a tutorial," in IEEE Communications Magazine, vol. 44, No. 9, pp. 46-50, Sep. 2006.*
Partial English Translation and Abstract of Chinese Patent Application No. CN101119356, Aug. 5, 2016, 5 pages.
Partial English Translation and Abstract of Chinese Patent Application No. CN104811143, Aug. 5, 2016, 3 pages.
Partial English Translation and Abstract of Chinese Patent Application No. CN201114160, Aug. 5, 2016, 6 pages.
Foreign Communication From a Counterpart Application, PCT Application No. PCT/CN2015/092097, English Translation of International Search Report dated Jan. 22, 2016, 3 pages.
Foreign Communication From a Counterpart Application, PCT Application No. PCT/CN2015/092097, Written Opinion dated Jan. 22, 2016, 6 pages.
Machine Translation and Abstract of Chinese Publication No. CN101262240, Sep. 10, 2008, 9 pages.
Machine Translation and Abstract of Chinese Publication No. CN103248380, Part 1, Aug. 14, 2013, 18 pages.
Machine Translation and Abstract of Chinese Publication No. CN103248380, Part 2, Aug. 14, 2013, 9 pages.
Machine Translation and Abstract of Chinese Publication No. CN201464557, May 12, 2010, 13 pages.
Foreign Communication From A Counterpart Application, European Application No. 15876399.5, European Office Action dated Mar. 21, 2017, 8 pages.
Foreign Communication From A Counterpart Application, Chinese Application No. 201510117704.1, Chinese Office Action dated Apr. 21, 2017, 7 pages.
Foreign Communication From A Counterpart Application, European Application No. 15876399.5, Extended European Search Report dated Jun. 28, 2017, 13 pages.

* cited by examiner

SIGNAL FREQUENCY CONVERSION CIRCUIT AND SIGNAL FREQUENCY CONVERSION METHOD

CROSS-REFERENCE TO RELATED APPLICATIONS

This application is a continuation application of international patent application number PCT/CN2015/092097 filed on Oct. 16, 2015,which claims priority to Chinese patent application number 201510117704.1 filed on Mar. 17, 2015, both of which are incorporated by reference.

TECHNICAL FIELD

The present disclosure relates to the communications field, and in particular, to a signal frequency conversion circuit and a signal frequency conversion method.

BACKGROUND

With development of mobile communications, a communications system has been developed from a single carrier system to a multicarrier system, and frequency-selective processing for a carrier is completed by using a digital intermediate frequency technology, which also becomes a common technology in the current communications field.

With arrival of a mobile broadband (MBB) era, radio access evolves from fourth generation (4G) to fifth generation (5G), a quantity of antennas of the system rises from 1 or 2 to 64-128,a bandwidth rises from 20 megahertz (MHz) to 1000 MHz; therefore, it is required to consider an effective up- and down-frequency conversion circuit technology that is suitable for a 5G era.

FIG. 1 shows a multicarrier intermediate frequency chain in wireless communications. A main receiving process in an upstream direction is as follows: a radio frequency air interface signal is received by an antenna; the signal is successively filtered by a duplex filter (DUP), amplified by a low-noise amplifier (LNA), and frequency-converted by a demodulator (DEMOD) to obtain a signal on an intermediate frequency; a digital intermediate frequency signal is output by using a high-precision analog-to-digital converter (ADC) to perform sampling on the signal; a low-speed baseband signal is output by using a digital down converter (DDC) to perform signal frequency conversion and using a sampling rate converter (SRC) to perform sampling rate conversion respectively; and the low-speed baseband signal is transmitted back to a baseband processing unit by using an optical fiber. A main process in a downstream sending direction is as follows: after performing sampling rate conversion on a low-speed baseband signal, an SRC outputs a high-speed baseband signal; after performing frequency conversion on the high-speed baseband signal, a digital up converter (DUC) outputs a digital intermediate frequency signal; then the digital intermediate frequency signal is converted to an analog intermediate frequency signal by a digital-to-analog converter (DAC); and after being modulated by a modulator (MIXER), amplified by a power amplifier (PA), and filtered by a DUP successively, the analog intermediate frequency signal is changed to a radio frequency signal.

In some approaches, an implementation structure of a combination of a DDC and an SRC is used for signal down-conversion of converting a digital intermediate frequency signal to a baseband signal, and an implementation structure of a combination of a DUC and an SRC is used for signal up-conversion of converting a baseband signal to a digital intermediate frequency signal. That is, in some approaches, an implementation structure of a combination of an SRC with a DUC or DDC is used for both the signal up-conversion and the signal down-conversion. The combination of the DUC and the SRC is used as an example, generally, the DUC is implemented by using a Coordinate Rotation Digital Computer (CORDIC) and an improved manner of the CORDIC, and a structure principle of the CORDIC and the improved manner of the CORDIC is shown in FIG. 2, where input of a phase rotator is a frequency control word and a phase control word, and output is a rotation angle:

$$\phi_{i+1} = \phi_i + \overline{\omega} + \phi_{init}$$

where $\phi_{init}$ represents an initial phase; $\phi_i$ represents a phase angle of current rotation; $\phi_{i+1}$ represents a phase angle of next rotation; and $\overline{\omega}$ represents a frequency control word.

A butterfly circuit is used to generate a sine (sin θ) and a cosine (cos θ) signal.

When an in-phase and quadrature (IQ) signal is input, multiplication of an original IQ signal and a cos+j*sin complex signal is implemented by using a complex multiplication circuit:

$$I_{out} = I_{in} * \cos\theta - Q_{in} * \sin\theta;$$

$$Q_{out} = I_{in} * \sin\theta + Q_{in} * \cos\theta;$$

where $I_{in}$ and $Q_{in}$ are output of the complex multiplication circuit and are input original IQ signals, and sin θ and cos θ are a sine signal and a cosine signal that are generated by the butterfly circuit; therefore, the whole DUC outputs a digital frequency mixing signal, and when no IQ signal input, the DUC outputs the sine signal or the cosine signal.

Generally, a decimation half-band filter (HBF) or an interpolation HBF is used in an implementation structure of the SRC, and the HBF is a finite impulse response filter (FIR) with special coefficients, where a half of the coefficients are 0. An implementation principle of the HBF is shown in FIG. 3, where x(n) is an input signal, y(n) is output of the SRC, and h(n) is a coefficient of the filter.

However, an existing frequency conversion circuit is a single-stage frequency conversion; therefore, a numerically controlled oscillator (NCO) needs to be implemented on a high-multiple clock. However, a CORDIC algorithm used by the NCO needs to implement complex logic such as a multiplier and an adder to complete computation of various transcendental functions, and implementing the complex logic such as the multiplier and the adder on the high-multiple clock may make a hardware circuit more complex to a great extent; therefore, circuit resource costs of the frequency conversion circuit are increased.

SUMMARY

Embodiments of the present disclosure provide a signal frequency conversion circuit, where the signal frequency conversion circuit is configured to reduce resource costs of the signal frequency conversion circuit.

In view of this, a first aspect of the present disclosure provides a signal frequency conversion circuit, including a primary-stage frequency conversion module and at least one subsequent-stage frequency conversion module that is in series connection, where the primary-stage frequency conversion module includes a first filter and an NCO, and an output of the first filter is connected to an input of the NCO; each subsequent-stage frequency conversion module includes a second filter and a subsequent-stage frequency conversion unit, and an output of the second filter is connected to an input of the subsequent-stage frequency conversion unit; and an output of the NCO is connected to an input of a second filter in a first subsequent-stage frequency conversion module in the at least one subsequent-stage frequency conversion module in series connection.

With reference to the first aspect of the present disclosure, in a first implementation manner of the first aspect of the present disclosure, the NCO is configured to implement signal frequency conversion in a range of 0 to 1/N*Fs, where Fs is an input sampling rate of the NCO; and the subsequent-stage frequency conversion unit is configured to implement 0 or 1/N*Fd signal frequency conversion, where Fd is an input sampling rate of the subsequent-stage frequency conversion unit.

With reference to the first implementation manner of the first aspect of the present disclosure, in a second implementation manner of the first aspect of the present disclosure, a value of the N includes 2, 4, 8,or 16.

With reference to the first aspect of the present disclosure, the first implementation manner of the first aspect of the present disclosure, or the second implementation manner of the first aspect of the present disclosure, in a third implementation manner of the first aspect of the present disclosure, the first filter and the second filter are interpolation half-band filters HBFs.

With reference to the third implementation manner of the first aspect of the present disclosure, in a fourth implementation manner of the first aspect of the present disclosure, an interpolation multiple of the interpolation HBF is 2.

With reference to the third implementation manner of the first aspect of the present disclosure or the fourth implementation manner of the first aspect of the present disclosure, in a fifth implementation manner of the first aspect of the present disclosure, the NCO and the subsequent-stage frequency conversion unit are configured to implement up-conversion.

With reference to the first aspect of the present disclosure, the first implementation manner of the first aspect of the present disclosure, or the second implementation manner of the first aspect of the present disclosure, in a sixth implementation manner of the first aspect of the present disclosure, the first filter and the second filter are decimation HBFs.

With reference to the sixth implementation manner of the first aspect of the present disclosure, in a seventh implementation manner of the first aspect of the present disclosure, a decimation coefficient of the decimation HBF is 2.

With reference to the sixth implementation manner of the first aspect of the present disclosure or the seventh implementation manner of the first aspect of the present disclosure, in an eighth implementation manner of the first aspect of the present disclosure, the NCO and the subsequent-stage frequency conversion unit are configured to implement down-conversion.

With reference to the first aspect of the present disclosure, the first implementation manner of the first aspect of the present disclosure, the second implementation manner of the first aspect of the present disclosure, the third implementation manner of the first aspect of the present disclosure, a fourth implementation manner of a first aspect of the present disclosure, the fifth implementation manner of the first aspect of the present disclosure, a sixth implementation manner of a first aspect of the present disclosure, a seventh implementation manner of a first aspect of the present disclosure, or an eight implementation manner of a first aspect of the present disclosure, in a ninth implementation manner of the first aspect of the present disclosure, the NCO is implemented by using a CORDIC algorithm.

A second aspect of the present disclosure provides a signal frequency conversion method, including receiving, by a first filter in a primary-stage frequency conversion module, an input signal; processing, by the first filter, the input signal, and sending a signal obtained by the first filter to an NCO in the primary-stage frequency conversion module; performing, by the NCO, primary-stage frequency conversion on the signal obtained by the first filter to obtain an intermediate signal, and sending the intermediate signal to a second filter in a subsequent-stage frequency conversion module; processing, by the second filter, the intermediate signal, and sending a signal obtained by the second filter to a subsequent-stage frequency conversion unit in the subsequent-stage frequency conversion module; and performing, by the subsequent-stage frequency conversion unit, subsequent-stage frequency conversion on the signal obtained by the second filter to obtain a target signal.

With reference to the second aspect of the present disclosure, in a first implementation manner of the second aspect of the present disclosure, the processing, by the first filter, the input signal includes performing, by the first filter, interpolation filtering on the input signal, or performing, by the first filter, decimation filtering on the input signal.

With reference to the second aspect of the present disclosure, in a second implementation manner of the second aspect of the present disclosure, the performing, by the NCO, primary-stage frequency conversion on the signal obtained by the first filter, and obtaining an intermediate signal is specifically: performing, by the NCO, frequency conversion in a range of 0 to 1/N*Fs on the signal obtained by the first filter to output the intermediate signal, where Fs is an input sampling rate of the NCO.

With reference to the second aspect of the present disclosure, in a third implementation manner of the second aspect of the present disclosure, the processing, by the second filter, the intermediate signal includes: performing, by the second filter, interpolation filtering on the intermediate signal, or performing, by the second filter, decimation filtering on the intermediate signal.

With reference to the second aspect of the present disclosure, in a fourth implementation manner of the second aspect of the present disclosure, the performing, by the subsequent-stage frequency conversion unit, subsequent-stage frequency conversion on the signal obtained by the second filter to obtain a target signal is performing, by the subsequent-stage frequency conversion unit, 0 frequency conversion on the signal obtained by the second filter, or performing, by the subsequent-stage frequency conversion unit, 1/N*Fd frequency conversion on the signal obtained by the second filter, where Fd is an input sampling rate of the subsequent-stage frequency conversion unit.

With reference to the second aspect of the present disclosure, the first implementation manner of the second aspect of the present disclosure, the second implementation manner of the second aspect of the present disclosure, or the third implementation manner of the second aspect of the present disclosure, in a fourth implementation manner of the second aspect of the present disclosure, after the performing, by the subsequent-stage frequency conversion unit, subsequent-stage frequency conversion on the signal obtained by the second filter to obtain a target signal, the method further includes, if the target signal does not meet a frequency conversion requirement, sending, by the subsequent-stage frequency conversion unit, the target signal to a second filter in a next subsequent-stage frequency conversion module.

It may be learned from the foregoing technical solutions that the embodiments of the present disclosure have the following advantages. In the signal frequency conversion circuit, a primary-stage frequency conversion module performs frequency conversion for the first time on an input signal to output an intermediate signal; then at least one subsequent-stage frequency conversion module performs frequency conversion on the intermediate signal for at least one time to obtain a target signal that meets a frequency conversion requirement. That is, in this solution, a signal frequency conversion requirement is met by performing frequency conversion for a plurality of times. Compared with some approaches, this solution uses a manner of multistage frequency conversion, and therefore an NCO used in this solution is an NCO implemented on a clock frequency with a multiple lower than that in some approaches, which avoids implementing the NCO on a high-multiple clock and avoids complex processing logic such as a multiplier and an adder required for implementing the NCO. Therefore, power consumption and costs of a circuit for implementing the NCO are effectively reduced.

DESCRIPTION OF EMBODIMENTS

Embodiments of the present disclosure provide a signal frequency conversion circuit, where the signal frequency conversion circuit is configured to implement a frequency conversion requirement of an input signal by means of multistage frequency conversion, which avoids implementing a multiplier on a high-multiple NCO and reduces complexity of the signal frequency conversion circuit; therefore, power consumption and costs of the signal frequency conversion circuit are reduced.

To make persons skilled in the art understand the technical solutions in the present disclosure better, the following clearly describes the technical solutions in the embodiments of the present disclosure with reference to the accompanying drawings in the embodiments of the present disclosure. The described embodiments are merely some but not all of the embodiments of the present disclosure. All other embodiments obtained by persons of ordinary skill in the art based on the embodiments of the present disclosure without creative efforts shall fall within the protection scope of the present disclosure.

In the specification, claims, and accompanying drawings of the present disclosure, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments of the present disclosure described herein can be implemented in other orders than the order illustrated or described herein. Moreover, the terms "include", "contain" and any other variants mean to cover the non-exclusive inclusion, for example, a process, method, system, product, or device that includes a list of steps or units is not necessarily limited to those steps or units, but may include other steps or units not expressly listed or inherent to such a process, method, system, product, or device.

Figure 1:
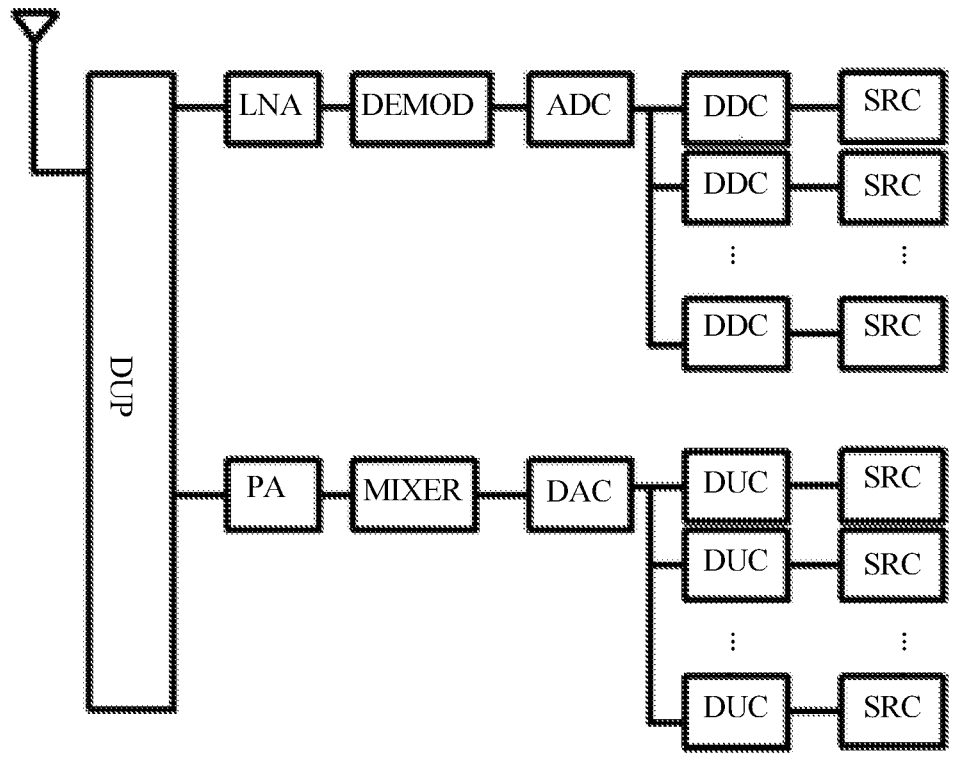
FIG. 1 is a schematic diagram of a multi-carrier intermediate frequency link in wireless communication.
Figure 2:
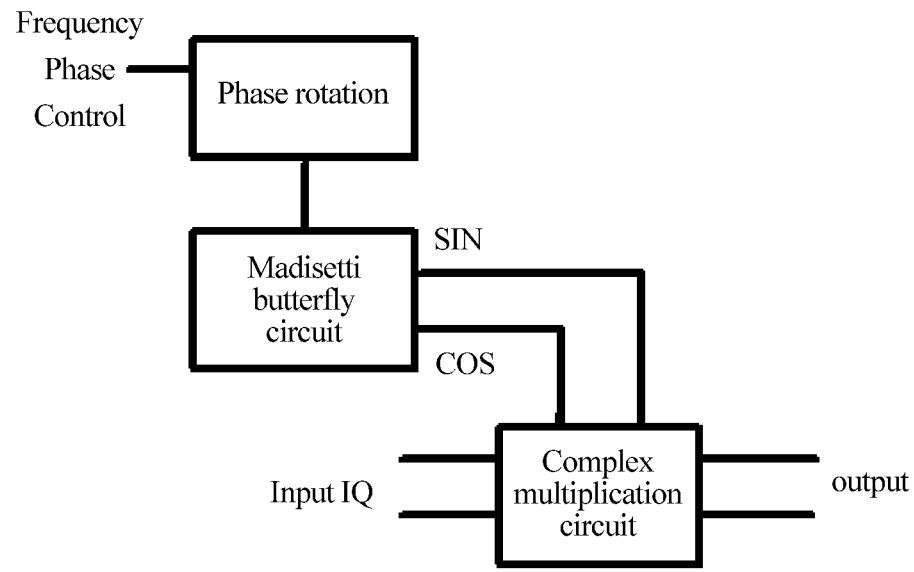
FIG. 2 is a structural principle diagram of a CORDIC and an improved manner of the CORDIC.
Figure 3:
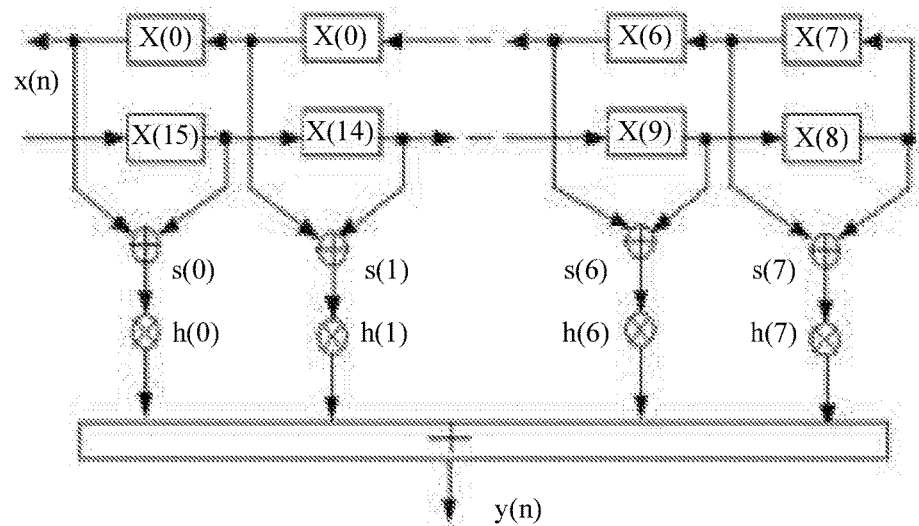
FIG. 3 is an implementation principle diagram of an HBF.
Figure 4:
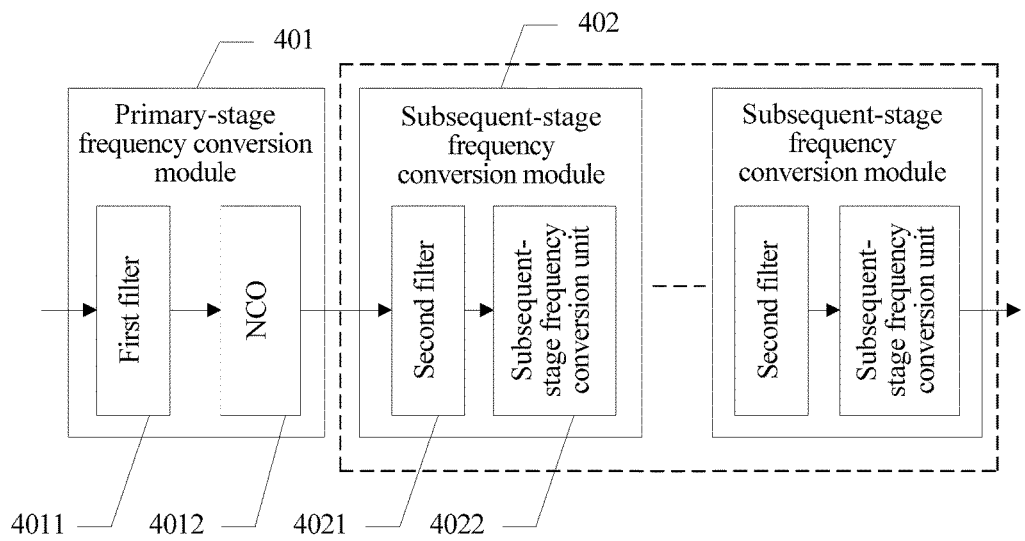
FIG. 4 is a schematic diagram of an embodiment of a signal frequency conversion circuit according to an embodiment of the present disclosure.

Referring to FIG. 4, an embodiment of a signal frequency conversion circuit in the embodiments of the present disclosure includes a primary-stage frequency conversion module 401 configured to perform primary-stage processing on a received input signal and output an intermediate signal; and at least one subsequent-stage frequency conversion module 402 in series connection configured to process the intermediate signal output by the primary-stage frequency conversion module to output a target signal.

The primary-stage frequency conversion module 401 includes a first filter 4011 configured to perform sampling rate conversion processing on the received input signal, and output a signal obtained by the first filter 4011 to an NCO; and the NCO 4012 configured to perform primary-stage frequency conversion on the signal obtained by the first filter 4011 to obtain the intermediate signal, and output the intermediate signal.

The subsequent-stage frequency conversion module 402 includes a second filter 4021 configured to perform sampling rate conversion processing on a received signal, and output a signal obtained by the second filter 4021 to a subsequent-stage frequency conversion unit; and the subsequent-stage frequency conversion unit 4022 configured to perform subsequent-stage frequency conversion on the signal obtained by the second filter to obtain the target signal.

In this embodiment, the NCO 4012 is configured to implement signal frequency conversion in a range of 0 to 1/N*Fs, where Fs is an input sampling rate of the NCO 4012; the subsequent-stage frequency conversion module 4022 is configured to implement 0 or 1/N*Fd signal frequency conversion, where Fd is an input sampling rate of the subsequent-stage frequency conversion module 4022, and a value of N may be 2, 4, 8,or 16,or may be another value that is 2 raised to a power of any number, which is specifically determined according to an actual circuit, and is not limited herein.

In this embodiment and a subsequent embodiment, the subsequent-stage frequency conversion unit is implemented as follows.

Output of a real part: $Re[(I+jQ)*(\cos(2*pi*1/N*fd*t)+j*\sin(2*pi*1/N*fd*t))]=I*\cos(pi/2*(0:n-1))-Q*\sin(pi/2*(0:n-1))$, and I0, −Q1, −I2, Q3, . . . are successively cyclically output.

Output of an imaginary part: $Imag[(I+jQ)*(\cos(2*pi*1/N*fd*t)+j*\sin(2*pi*1/N*fd*t))]=I*\sin(pi/2*(0:n-1))+Q*\cos(pi/2*(0:n-1))$, and Q0, I1, −Q2, -I3, . . . are successively cyclically output.

I and Q are IQ signals output by an HBF, fd is an input sampling rate of the subsequent-stage frequency conversion unit, t is time, n represents a discrete sampling sequence, (0:n−1) represents a sequence from 0 to n−1,$t=(0:n-1)*T=$ (0:n−1)*1/Fd, and pi=Π. In the subsequent embodiment, implementation of the subsequent-stage frequency conversion unit is not repeatedly described.

It should be noted that, in this embodiment, the NCO is implemented by using a CORDIC algorithm. In a practical application, the NCO may also be implemented in another manner, which is not specifically limited herein.

According to the signal frequency conversion circuit in this embodiment of the present disclosure, a primary-stage frequency conversion module performs frequency conversion for the first time on an input signal to output an intermediate signal; then at least one subsequent-stage frequency conversion module performs frequency conversion on the intermediate signal for at least one time to obtain a target signal that meets a frequency conversion requirement. That is, in this solution, a signal frequency conversion requirement is met by performing frequency conversion for a plurality of times. Compared with some approaches, this solution uses a manner of multistage frequency conversion, and therefore an NCO used in this solution is an NCO implemented on a clock frequency with a multiple lower than that in some approaches, which avoids implementing the NCO on a high-multiple clock and avoids complex processing logic such as a multiplier and an adder required for implementing the NCO. Therefore, power consumption and costs of a circuit for implementing the NCO are effectively reduced.

In a practical application, the signal frequency conversion circuit in this embodiment of the present disclosure may be specifically applied to signal up-conversion or signal down-conversion, and the following provides descriptions separately.

The signal frequency conversion circuit is applied to signal up-conversion.

Figure 5:
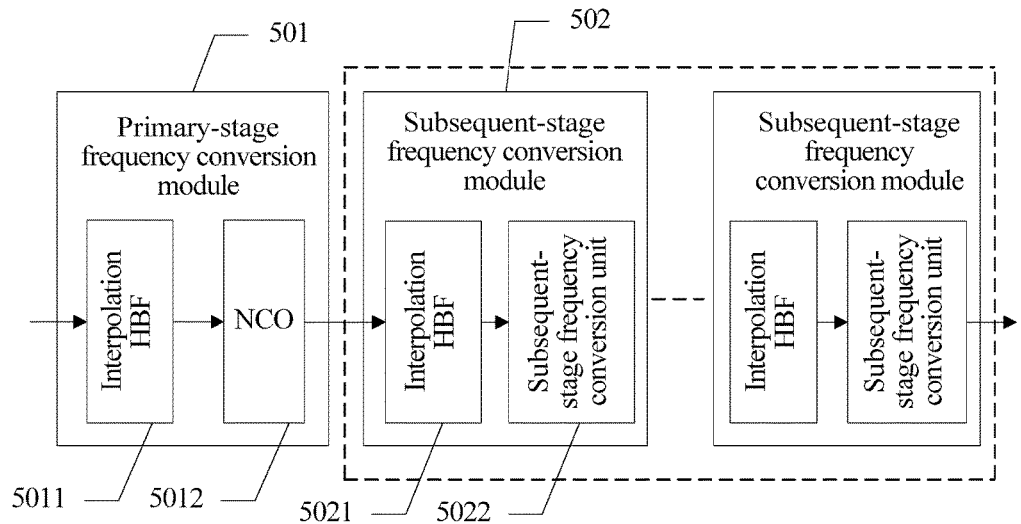
FIG. 5 is a schematic diagram of another embodiment of a signal frequency conversion circuit according to an embodiment of the present disclosure.

Referring to FIG. 5, another embodiment of a signal frequency conversion circuit in the embodiments of the present disclosure includes a primary-stage frequency conversion module 501 configured to perform primary-stage processing on a received input signal and output an intermediate signal; and at least one subsequent-stage frequency conversion module 502 in series connection configured to process the intermediate signal output by the primary-stage frequency conversion module to output a target signal.

The primary-stage frequency conversion module 501 include: an interpolation HBF 5011 configured to perform sampling rate interpolation conversion processing on the received input signal, and output a signal obtained by the interpolation HBF 5011 to an NCO; and the NCO 5012 configured to perform primary-stage up-conversion on the signal obtained by the interpolation HBF 5011 to obtain the intermediate signal, and output the intermediate signal.

The subsequent-stage frequency conversion module 502 includes an interpolation HBF 5021 configured to perform sampling rate interpolation conversion processing on a received signal, and output a signal obtained by the interpolation HBF 5021 to a subsequent-stage frequency conversion unit 5022; and the subsequent-stage frequency conversion unit 5022 configured to perform subsequent-stage up-conversion on the signal obtained by the interpolation HBF 5021 to obtain the target signal.

In this embodiment, the NCO 5012 is configured to implement signal up-conversion in a range of 0 to 1/N*Fs, where Fs is an input sampling rate of the NCO 5012; the subsequent-stage frequency conversion module 5022 is configured to implement 0 or 1/N*Fd signal up-conversion, where Fd is an input sampling rate of the subsequent-stage frequency conversion module 5022, and a value of N may be 2, 4, 8, or 16, or may be another value that is 2 raised to a power of any number, which is specifically determined according to an actual circuit, and is not limited herein.

Figure 6:
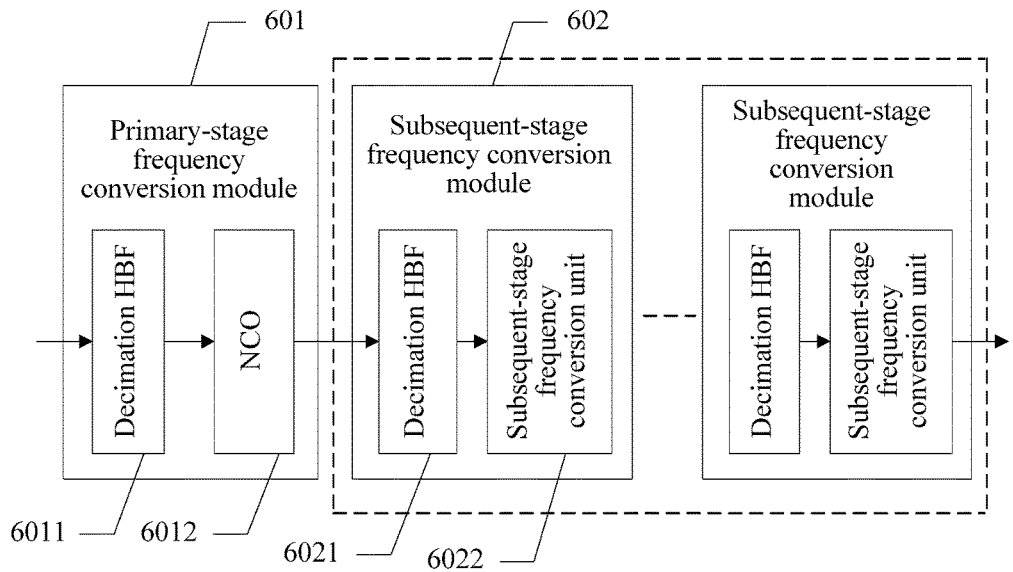
FIG. 6 is a schematic diagram of another embodiment of a signal frequency conversion circuit according to an embodiment of the present disclosure.

The signal frequency conversion circuit is applied to signal down-conversion:

Referring to FIG. 6, another embodiment of a signal frequency conversion circuit in the embodiments of the present disclosure includes a primary-stage frequency conversion module 601 configured to perform primary-stage processing on a received input signal and output an intermediate signal; and at least one subsequent-stage frequency conversion module 602 in series connection configured to process the intermediate signal output by the primary-stage frequency conversion module to output a target signal.

The primary-stage frequency conversion module 601 includes a decimation HBF 6011 configured to perform sampling rate decimation conversion processing on the received input signal, and output a signal obtained by the decimation HBF 6011 to an NCO; and the NCO 6012 configured to perform primary-stage down-conversion on the signal obtained by the decimation HBF 6011 to obtain the intermediate signal, and output the intermediate signal.

The subsequent-stage frequency conversion module 602 includes a decimation HBF 6021 configured to perform sampling rate decimation conversion processing on a received signal, and output a signal obtained by the decimation HBF 6021 to a subsequent-stage frequency conversion unit 6022; and the subsequent-stage frequency conversion unit 6022 configured to perform subsequent-stage down-conversion on the signal obtained by the decimation HBF 6021 to obtain the target signal.

In this embodiment, the NCO 6012 is configured to implement signal down-conversion in a range of 0 to 1/N*Fs, where Fs is an input sampling rate of the NCO 6012; the subsequent-stage frequency conversion module 6022 is configured to implement 0 or 1/N*Fd signal down-conversion, where Fd is an input sampling rate of the subsequent-stage frequency conversion module 6022, and a value of N may be 2, 4, 8, or 16, or may be another value that is 2 raised to a power of any number, which is specifically determined according to an actual circuit, and is not limited herein.

Figure 7:
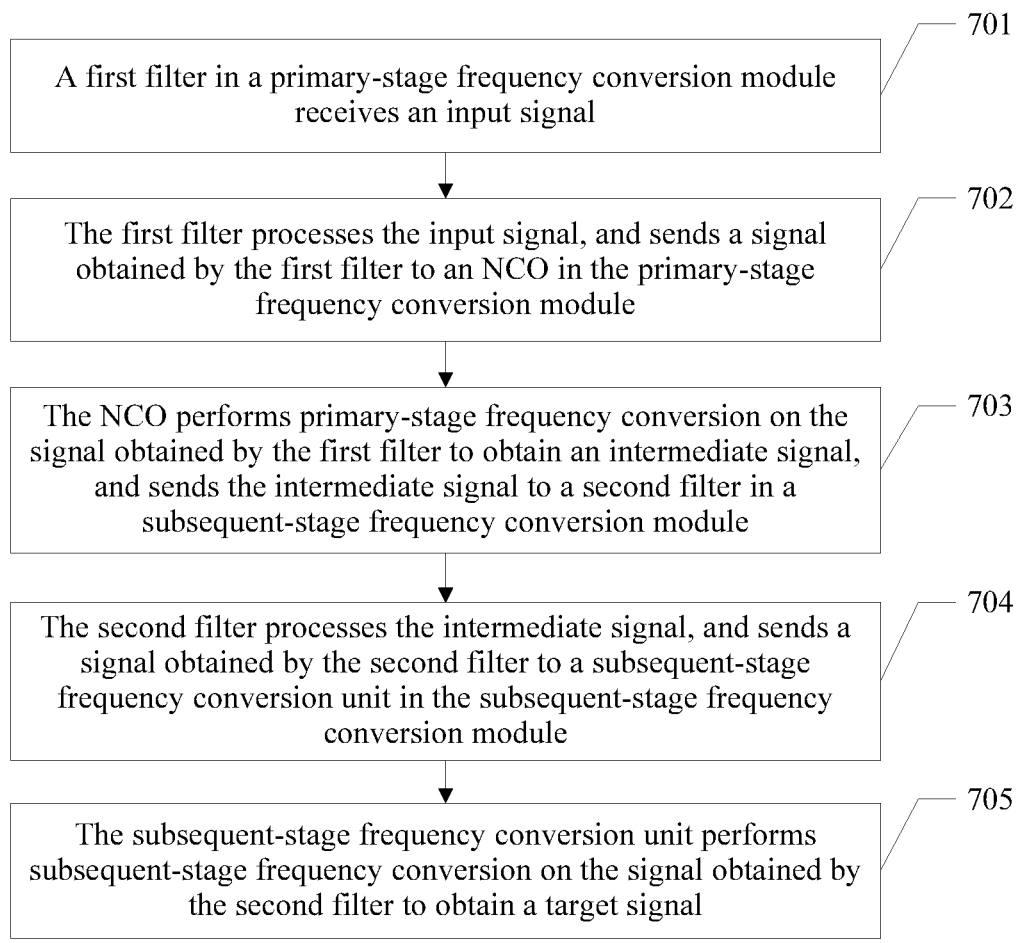
FIG. 7 is a flowchart of an embodiment of a signal frequency conversion method according to an embodiment of the present disclosure.

The foregoing describes the signal frequency conversion circuit in the embodiments of the present disclosure, based on the signal frequency conversion circuit, the embodiments of the present disclosure further provide a signal frequency conversion method, and the following describes the signal frequency conversion method in the embodiments of the present disclosure:

Referring to FIG. 7, an embodiment of a signal frequency conversion method in the embodiments of the present disclosure includes the following steps.

701. A first filter in a primary-stage frequency conversion module receives an input signal.

In this embodiment, the first filter in the primary-stage frequency conversion module is used as an input of an entire signal frequency conversion circuit, and receives the input signal.

It should be noted that, in a practical application, the first filter may be an interpolation HBF or a decimation HBF, which is not specifically limited herein.

702. The first filter processes the input signal, and sends a signal obtained by the first filter to an NCO in the primary-stage frequency conversion module.

In this embodiment, after receiving the input signal, the first filter processes the input signal, and sends the signal obtained by the first filter to the NCO in the primary-stage frequency conversion module.

It should be noted that the first filter processes the input signal may be that the first filter performs interpolation filtering on the input signal when signal up-conversion is performed, or the first filter performs decimation filtering on the input signal when signal down-conversion is performed, which is not specifically limited herein.

703. The NCO performs primary-stage frequency conversion on the signal obtained by the first filter to obtain an intermediate signal, and sends the intermediate signal to a second filter in a subsequent-stage frequency conversion module.

In this embodiment, the NCO performs primary-stage frequency conversion on the signal obtained by the first filter, obtains the intermediate signal, and sends the intermediate signal to the second filter in the subsequent-stage frequency conversion module.

It should be noted that, that the NCO performs primary-stage frequency conversion on the signal obtained by the first filter to obtain an intermediate signal is: performing, by the NCO, frequency conversion in a range of 0 to $1/N*Fs$ on the signal obtained by the first filter to output the intermediate signal, where Fs is an input sampling rate of the NCO.

704. The second filter processes the intermediate signal, and sends a signal obtained by the second filter to a subsequent-stage frequency conversion unit in the subsequent-stage frequency conversion module.

In this embodiment, after receiving the intermediate signal, the second filter in the subsequent-stage frequency conversion module processes the intermediate signal, and sends the signal obtained by the second filter to the subsequent-stage frequency conversion unit in the subsequent-stage frequency conversion module.

In a practical application, the second filter may be an interpolation HBF or a decimation HBF, which is not specifically limited herein.

It should be noted that the second filter processes an input signal may be that the second filter performs interpolation filtering on the input signal when signal up-conversion is performed, or the second filter performs decimation filtering on the input signal when signal down-conversion is performed, which is not specifically limited herein.

705. The subsequent-stage frequency conversion unit performs subsequent-stage frequency conversion on the signal obtained by the second filter to obtain a target signal.

In this embodiment, the subsequent-stage frequency conversion unit performs subsequent-stage frequency conversion on the signal obtained by the second filter and obtains the target signal.

That the subsequent-stage frequency conversion unit performs subsequent-stage frequency conversion on the signal obtained by the second filter may be that the subsequent-stage frequency conversion unit performs 0 frequency conversion on the signal obtained by the second filter, or the subsequent-stage frequency conversion unit performs $1/N*Fd$ frequency conversion on the signal obtained by the second filter, where Fd is an input sampling rate of the subsequent-stage frequency conversion unit.

According to a signal frequency conversion circuit in this embodiment of the present disclosure, a primary-stage frequency conversion module performs frequency conversion for the first time on an input signal to output an intermediate signal; then at least one subsequent-stage frequency conversion module performs frequency conversion on the intermediate signal for at least one time to obtain a target signal that meets a frequency conversion requirement. That is, in this solution, a signal frequency conversion requirement is met by performing frequency conversion for a plurality of times. Compared with some approaches, this solution uses a manner of multistage frequency conversion, and therefore an NCO used in this solution is an NCO implemented on a clock frequency with a multiple lower than that in some approaches, which avoids implementing the NCO on a high-multiple clock and avoids complex processing logic such as a multiplier and an adder required for implementing the NCO. Therefore, power consumption and costs of a circuit for implementing the NCO are effectively reduced.

It should be noted that, in a practical application, if a target signal obtained after a subsequent-stage frequency conversion module performs frequency conversion on an intermediate signal once does not meet a frequency conversion requirement, a subsequent-stage frequency conversion unit in subsequent-stage frequency conversion sends the target signal to a second filter in a next subsequent-stage frequency conversion module for processing, until a target signal obtained after frequency conversion is performed for a plurality of times meets the frequency conversion requirement.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A signal frequency conversion circuit comprising:
   a primary-stage frequency converter comprising:
      a first filter comprising a first filter output; and
      a numerically controlled oscillator (NCO) comprising an NCO input and an NCO output, wherein the NCO input is coupled to the first filter output, wherein the NCO is configured to implement signal frequency conversion in a range of 0 to $1/N*Fs$; and
   a subsequent-stage frequency converter coupled in series to the primary stage frequency converter and comprising:

a second filter comprising a second filter input and a second filter output, wherein the second filter input is coupled in series to the NCO output; and a frequency conversion unit (FCU) comprising an FCU input and an FCU output, wherein the FCU input is coupled to the second filter output;

wherein the subsequent-stage frequency converter is configured to implement 0 or 1/N*Fd signal frequency conversion; and wherein Fs is an input sampling rate of the NCO, Fd is an input sampling rate of the FCU and N is an integer number.

2. The signal frequency conversion circuit of claim 1, wherein N is 2 raised to an integer power.

3. The signal frequency conversion circuit of claim 1, wherein the first filter and the second filter are interpolation half-band filters (HBFs).

4. The signal frequency conversion circuit of claim 3, wherein an interpolation multiple of the interpolation HBFs is 2.

5. The signal frequency conversion circuit of claim 3, wherein the NCO and the FCU are configured to implement up-conversion.

6. The signal frequency conversion circuit of claim 1, wherein the first filter and the second filter are decimation half-band filters (HBFs).

7. The signal frequency conversion circuit of claim 6, wherein a decimation coefficient of the decimation HBFs is 2.

8. The signal frequency conversion circuit of claim 6, wherein the NCO and the FCU are configured to implement down-conversion.

9. The signal frequency conversion circuit of claim 1, wherein a Coordinate Rotation Digital Computer (CORDIC) algorithm implements the NCO.

10. A signal frequency conversion method comprising:
receiving, by a first filter in a primary-stage frequency converter, an input signal;
processing, by the first filter, the input signal;
sending, by the first filter, a first signal to a numerically controlled oscillator (NCO) in the primary-stage frequency conversion module;
performing, by the NCO, primary-stage frequency conversion on the first signal to obtain an intermediate signal by performing frequency conversion on the first signal in a range of 0 to 1/N*Fs, wherein Fs is an input sampling rate of the NCO and N is an integer number;
sending, by the NCO, the intermediate signal to a second filter in a subsequent-stage frequency converter;
processing, by the second filter, the intermediate signal;
sending, by the second filter, a second signal to a frequency conversion unit (FCU) in the subsequent-stage frequency converter; and
performing, by the FCU, subsequent-stage frequency conversion on the second signal to obtain a target signal.

11. The method of claim 10, wherein processing the input signal comprises performing, by the first filter, interpolation filtering on the input signal.

12. The method of claim 10, wherein processing the input signal comprises performing, by the first filter, decimation filtering on the input signal.

13. The method of claim 10, wherein N is 2 raised to an integer power.

14. The method of claim 10, wherein processing the intermediate signal comprises performing, by the second filter, interpolation filtering on the intermediate signal.

15. The method of claim 10, wherein processing the intermediate signal comprises performing, by the second filter, decimation filtering on the intermediate signal.

16. The method of claim 10, wherein performing subsequent-stage frequency conversion on the second signal comprises performing, by the FCU, 0 frequency conversion on the second signal obtained by the second filter.

17. The method of claim 10, wherein performing subsequent-stage frequency conversion comprises performing, by the FCU, 1/N*Fd frequency conversion on the second signal, wherein N is 2 raised to an integer power and Fd is an input sampling rate of the FCU.

18. The method of claim 10, wherein after performing subsequent-stage frequency conversion on the second signal, the method further comprises sending, by the FCU, the target signal to a second filter in a second subsequent-stage frequency converter when the target signal does not meet a frequency conversion requirement.

19. A signal frequency conversion method comprising:
receiving, by a first filter in a primary-stage frequency converter, an input signal;
processing, by the first filter, the input by performing interpolation filtering on the input signal;
sending, by the first filter, a first signal to a numerically controlled oscillator (NCO) in the primary-stage frequency conversion module;
performing, by the NCO, primary-stage frequency conversion on the first signal to obtain an intermediate signal by performing frequency conversion on the first signal in a range of 0 to 1/N*Fs, wherein Fs is an input sampling rate of the NCO and N is an integer number;
sending, by the NCO, the intermediate signal to a second filter in a subsequent-stage frequency converter;
processing, by the second filter, the intermediate signal;
sending, by the second filter, a second signal to a frequency conversion unit (FCU) in the subsequent-stage frequency converter; and
performing, by the FCU, subsequent-stage frequency conversion on the second signal to obtain a target signal.

20. The method of claim 19, wherein processing the input signal comprises performing interpolation filtering on decimation filtering on the input signal.

* * * * *